(12) United States Patent
Lu

(10) Patent No.: US 9,857,407 B2
(45) Date of Patent: Jan. 2, 2018

(54) DETECTION CIRCUIT AND DETECTION METHOD FOR SELF-CAPACITANCE TOUCH SCREEN

(71) Applicant: Shenzhen China Star Optoelectronics Technology Co., Ltd., Shenzhen, Guangdong (CN)

(72) Inventor: Yucheng Lu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 383 days.

(21) Appl. No.: 14/433,611

(22) PCT Filed: Dec. 17, 2014

(86) PCT No.: PCT/CN2014/094085
§ 371 (c)(1),
(2) Date: Apr. 3, 2015

(87) PCT Pub. No.: WO2016/090663
PCT Pub. Date: Jun. 16, 2016

(65) Prior Publication Data
US 2016/0370413 A1   Dec. 22, 2016

(30) Foreign Application Priority Data

Dec. 8, 2014 (CN) .......................... 2014 1 0745252

(51) Int. Cl.
*G01R 31/02* (2006.01)
*G06F 3/041* (2006.01)
(Continued)

(52) U.S. Cl.
CPC ............. *G01R 31/02* (2013.01); *G06F 3/044* (2013.01); *G06F 3/0418* (2013.01); *G06F 3/14* (2013.01)

(58) Field of Classification Search
CPC ......... G01R 31/02; G06F 3/14; G06F 3/0418; G06F 3/044
See application file for complete search history.

(56) References Cited

U.S. PATENT DOCUMENTS

| 2011/0134076 A1* | 6/2011 | Kida ..................... G06F 3/0412 345/174 |
| 2014/0361786 A1* | 12/2014 | Yao ......................... G06F 3/041 324/537 |
| 2015/0317033 A1 | 11/2015 | Chen et al. |

FOREIGN PATENT DOCUMENTS

| CN | 101908306 A | 12/2010 |
| CN | 102955627 A | 3/2013 |

(Continued)

*Primary Examiner* — Patrick Assouad
*Assistant Examiner* — Haidong Zhang
(74) *Attorney, Agent, or Firm* — Andrew C. Cheng

(57) ABSTRACT

The present invention discloses a detection circuit and a detection method of a self-capacitance touch screen. The detection circuit comprises a charging module and a voltage measuring module. The charging module is employed to connect the at least one touch control line for respectively charging a parasitic capacitance constructed by the at least one corresponding sensing electrode corresponded with the at least one touch control line and a ground by the charging module via the at least one touch control line at the same time in one detection period; the voltage measuring module is employed to electrically connect the at least one touch control line sequentially for acquiring a voltage measured value of the parasitic capacitance after charging via the at least one touch control line and outputting the voltage measured value, to obtain a detection result of normal or fault of the corresponding sensing electrode according to the voltage measured value after the charging module accomplishes charging and is disconnected from the at least one touch control line. With the aforementioned arrangement, (Continued)

the present is capable of simply and effectively achieving the detection of sensing electrodes.

12 Claims, 4 Drawing Sheets

(51) Int. Cl.
*G06F 3/14* (2006.01)
*G06F 3/044* (2006.01)

(56) References Cited

FOREIGN PATENT DOCUMENTS

| | | |
|---|---|---|
| CN | 203324956 U | 12/2013 |
| TW | 201224470 A1 | 6/2012 |
| TW | 201432536 A | 8/2014 |

\* cited by examiner

DETECTION CIRCUIT AND DETECTION METHOD FOR SELF-CAPACITANCE TOUCH SCREEN

FIELD OF THE INVENTION

The present invention relates to a touch screen technology field, and more particularly to a detection circuit and a detection method of a self-capacitance touch screen.

BACKGROUND OF THE INVENTION

Compared with the traditional technology of setting the touch panel on the liquid crystal panel, the research of unifying the touch panel function and the liquid crystal panel has gradually popular. Then, the embedded touch screen appears. The embedded touch screen comprises two types of in-cell and on-cell. The in-cell touch screen is the technology that the touch control circuit is integrated into the liquid crystal pixels. The on-cell touch screen is the technology that the touch control circuit is integrated between the color filter and the polarizer. Compared with the on-cell touch screen, the in-cell touch screen can make the panel to be thinner.

In the in-cell touch screen technology, the self-capacitance touch control detection skill is generally utilized for detecting the coordinates of the touch control point. The principle is to manufacture a plurality of sensing electrodes on the glass surface with ITO. These sensing electrodes respectively construct capacitances with the ground. The capacitances are self-capacitances, i.e. the capacitances of the sensing electrodes to the ground. When a finger touches the screen, the capacitance of the finger will overlay on the self-capacitance to increase the electric capacity of the self-capacitance. Therefore, the position of the touch control point can be detected by measuring the electric capacity variation of the capacitance of the sensing electrode to the ground.

Each sensing electrode is connected to the touch control IC via one touch control line to realize the scan to the sensing electrode by the touch control IC. Accordingly, the measurement of the electric capacity variation of the self-capacitance can be realized to achieve the touch control operations. However, disconnection or short can easily happen to each sensing electrode and results in being unable to achieve the touch control operations. Therefore, there is a need to provide a circuit capable of performing detection to the sensing electrode fault

SUMMARY OF THE INVENTION

An objective of the present invention solves is to provide a detection circuit and a detection method of a self-capacitance touch screen which are capable of simply and effectively achieving the detection of sensing electrodes.

For solving the aforesaid technical issues, one technical solution employed by the present invention is: to provide a detection circuit of a self-capacitance touch screen, and the self-capacitance touch screen comprises a plurality of sensing electrodes arranged in array and insulated with one another, and each sensing electrode is correspondingly coupled to a touch control line, and the detection circuit comprises: a charging module, a voltage measuring module, a control module, a first switch, a second switch and a multiplexer; each touch control line is electrically connected to a first channel of the multiplexer, and a second channel of the multiplexer is electrically connected to one end of the first switch, one end of the second switch, and the other end of the first switch is electrically connected to an output end of the charging module, and the other end of the second switch is electrically connected to an input end of the voltage measuring module, and the control module is respectively, electrically connected to a control end of the multiplexer, a control end of the first switch and a control end of the second switch; in one detection period, the control module controls the multiplexer to select the at least one touch control line to be electrically connected to the one end of the first switch, and controls the first switch to be conducted to electrically connect the charging module and the at least one touch control line for respectively charging a parasitic capacitance constructed by the at least one corresponding sensing electrode corresponded with the at least one touch control line and a ground by the charging module via the at least one touch control line at the same time, wherein a charging voltage outputted from the charging module is more than 5V; the control module controls the first switch to be off after charging the parasitic capacitance is accomplished, and controls the multiplexer to sequentially select one of the at least one touch control line to be electrically connected to the one end of the second switch, and the control module controls the second switch to be conducted as the touch control line selected by the multiplexer is electrically connected to the one end of the second switch to electrically connect the voltage measuring module and the touch control line selected by the multiplexer for acquiring a voltage measured value of the parasitic capacitance after charging via the touch control line selected by the multiplexer and outputting the voltage measured value, to obtain a detection result of normal or fault of the corresponding sensing electrode according to the voltage measured value.

The control module comprises a control logic unit and a pulse signal generating unit, and the control logic unit and the pulse signal generating unit are electrically connected to make the pulse signal generating unit output pulse signals, and a control end of the multiplexer is electrically connected to the control logic unit, and an output end of the pulse signal generating unit is electrically connected to the control end of the first switch, the control end of the second switch; the first switch is a N-type thin film transistor, and the second switch is a P-type thin film transistor, the first switch is conducted as the pulse signal generating unit outputs a high voltage level, and the second switch is conducted as the pulse signal generating unit outputs a low voltage level.

The voltage measuring module is a discharging circuit, employed to sequentially receive the voltage measured value fed back from the parasitic capacitance constructed by the at least one corresponding sensing electrode corresponded with the at least one touch control line and a ground; the detection circuit further comprises a process module and a display module, and the process module is electrically connected to an output end of the display module, and employed for sequentially reading the voltage measured value and determining whether the voltage measured value is in a predetermined range, and the display module is electrically connected to the process module, employed for showing a message that the corresponding sensing electrode is normal as the process module determines that the voltage measured value is in a first predetermined range, and showing a message that the corresponding sensing electrode is off as the process module determines that the voltage measured value is in a second predetermined range, and showing a message that the corresponding sensing electrode is short as the process module determines that the voltage measured value is in a third predetermined range.

The voltage measuring module comprises an amplifying circuit and an analog to digital conversion circuit, and an input end of the amplifying circuit is electrically connected to the other end of the second switch, and an output end of the amplifying circuit is electrically connected to an input end of the analog to digital conversion circuit, and an output end of the analog to digital conversion circuit is electrically connected to the process module.

The detection circuit further comprises a storage module, and the storage module is electrically connected to the process module, and employed for storing the voltage measured value.

The detection circuit further comprises an indicator, and the indicator is electrically connected to the process module, and the process module controls the indicator to illuminate as the process module determines that the voltage measured value is not in the first predetermined range to indicate that the corresponding sensing electrode is out of order.

For solving the aforesaid technical issues, another solution provided by the present invention is: to provide a detection circuit of a self-capacitance touch screen, and the self-capacitance touch screen comprises a plurality of sensing electrodes arranged in array and insulated with one another, and each sensing electrode is correspondingly coupled to a touch control line, and the detection circuit comprises: a charging module and a voltage measuring module; the charging module is employed to connect the at least one touch control line for respectively charging a parasitic capacitance constructed by the at least one corresponding sensing electrode corresponded with the at least one touch control line and a ground by the charging module via the at least one touch control line at the same time in one detection period; the voltage measuring module is employed to electrically connect the at least one touch control line sequentially for acquiring a voltage measured value of the parasitic capacitance after charging via the at least one touch control line and outputting the voltage measured value, to obtain a detection result of normal or fault of the corresponding sensing electrode according to the voltage measured value after the charging module accomplishes charging and is disconnected from the at least one touch control line.

The detection circuit comprises a control module, a first switch, a second switch and a multiplexer, and each touch control line is electrically connected to a first channel of the multiplexer, and a second channel of the multiplexer is electrically connected to one end of the first switch, one end of the second switch, and the other end of the first switch is electrically connected to an output end of the charging module, and the other end of the second switch is electrically connected to an input end of the voltage measuring module, and the control module is respectively, electrically connected to a control end of the multiplexer, a control end of the first switch and a control end of the second switch; in one detection period, the control module controls the multiplexer to select the at least one touch control line to be electrically connected to the one end of the first switch, and controls the first switch to be conducted to electrically connect the charging module and the at least one touch control line; the control module controls the first switch to be off after charging the parasitic capacitance is accomplished, and controls the multiplexer to sequentially select one of the at least one touch control line to be electrically connected to the one end of the second switch, and the control module controls the second switch to be conducted as the touch control line selected by the multiplexer is electrically connected to the one end of the second switch to electrically connect the voltage measuring module and the touch control line selected by the multiplexer.

The control module comprises a control logic unit and a pulse signal generating unit, and the control logic unit and the pulse signal generating unit are electrically connected to make the pulse signal generating unit output pulse signals, and a control end of the multiplexer is electrically connected to the control logic unit, and an output end of the pulse signal generating unit is electrically connected to the control end of the first switch, the control end of the second switch; the first switch is a N-type thin film transistor, and the second switch is a P-type thin film transistor, the first switch is conducted as the pulse signal generating unit outputs a high voltage level, and the second switch is conducted as the pulse signal generating unit outputs a low voltage level.

The voltage measuring module is a discharging circuit, employed to sequentially receive the voltage measured value fed back from the parasitic capacitance constructed by the at least one corresponding sensing electrode corresponded with the at least one touch control line and a ground; the detection circuit further comprises a process module and a display module, and the process module is electrically connected to an output end of the display module, and employed for sequentially reading the voltage measured value and determining whether the voltage measured value is in a predetermined range, and the display module is electrically connected to the process module, employed for showing a message that the corresponding sensing electrode is normal as the process module determines that the voltage measured value is in a first predetermined range, and showing a message that the corresponding sensing electrode is off as the process module determines that the voltage measured value is in a second predetermined range, and showing a message that the corresponding sensing electrode is short as the process module determines that the voltage measured value is in a third predetermined range.

The voltage measuring module comprises an amplifying circuit and an analog to digital conversion circuit, and an input end of the amplifying circuit is electrically connected to the other end of the second switch, and an output end of the amplifying circuit is electrically connected to an input end of the analog to digital conversion circuit, and an output end of the analog to digital conversion circuit is electrically connected to the process module.

The detection circuit further comprises a storage module, and the storage module is electrically connected to the process module, and employed for storing the voltage measured value.

The detection circuit further comprises an indicator, and the indicator is electrically connected to the process module, and the process module controls the indicator to illuminate as the process module determines that the voltage measured value is not in the first predetermined range to indicate that the corresponding sensing electrode is out of order.

For solving the aforesaid technical issues, another solution provided by the present invention is: to provide a detection method of a self-capacitance touch screen, wherein the self-capacitance touch screen comprises a plurality of sensing electrodes arranged in array and insulated with one another, and each sensing electrode is correspondingly coupled to a touch control line, and the detection method comprises: connecting the charging module and the at least one touch control line for respectively charging a parasitic capacitance constructed by the at least one corresponding sensing electrode corresponded with the at least one touch control line and a ground by the charging module via the at least one touch control line in one detection period;

disconnecting the charging module from the at least one touch control line after charging is accomplished; electrically connecting the voltage measuring module with the at least one touch control line sequentially after disconnecting to make the voltage measuring module acquire a voltage measured value of the parasitic capacitance after charging via the at least one touch control line and output the voltage measured value, to obtain a detection result of normal or fault of the corresponding sensing electrode according to the voltage measured value.

The step of outputting the voltage measured value comprises: showing the voltage measured value, or sending the voltage measured value to a display module to show the voltage measured value.

The benefits of the present invention are: different from the prior arts, in the detection period for the detection circuit of the present invention, the charging module first charges the parasitic capacitance constructed by the sensing electrode and the ground via the touch control line. After charging is accomplished, the voltage measuring module measures the voltage of the parasitic capacitance to acquire the voltage measured value of the parasitic capacitance after charging. The electric capacity of the parasitic capacitance constructed by the sensing electrode and the ground is basically stationary. Under normal circumstance, the parasitic capacitance possesses a certain voltage after charging and the voltage value is determined according to the charging volume. The voltage of the parasitic capacitance after charging is basically zero when the sensing electrode itself or the touch control line is disconnected and charging the parasitic capacitance cannot be performed. When the plurality of sensing electrodes are short or the plurality of touch control lines are short, which is equivalent to that parallel connection occurs to the plurality of parasitic capacitance and the total electric capacity increases. The charging rates of the parasitic capacitance which are short decrease in the same charging time and the same charging volume, i.e. the charging electric capacity decreases. Accordingly, the voltage of the parasitic capacitance decrease. Therefore, by acquiring the voltage measured value of the parasitic capacitance after charging according to the present invention, the detection result of normal or fault of the corresponding sensing electrode can be obtained according to the voltage measured value. Thereby, the detection to the sensing electrode can be realized.

DETAILED DESCRIPTION OF PREFERRED EMBODIMENTS

With the accompanying drawings and the specific embodiments, the present invention will be further described in detail.

Figure 1:
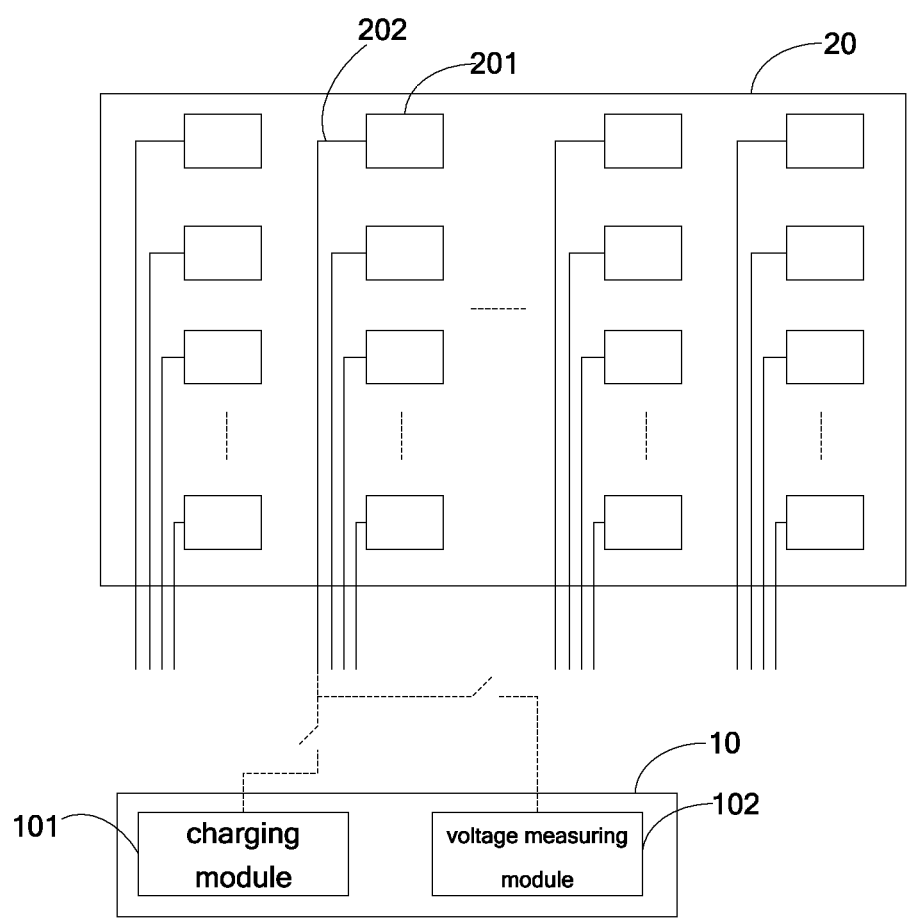
FIG. 1 is a structural diagram of a detection circuit of a self-capacitance touch screen according to one embodiment of the present invention.

Please refer to FIG. 1. In one embodiment of a detection circuit of self-capacitance touch screen applied with the present invention, the self-capacitance touch screen is a single layer self-capacitance touch screen. The touch control circuit for realizing the touch control function is merged in the pixel structures. Specifically, the touch screen panel 20 comprises a plurality of sensing electrodes 201 arranged in array and insulated with one another. The sensing electrodes 201 are employed for sensing the touch control signals which utilizes the common electrodes on the array substrate to realize it. Furthermore, each sensing electrode is formed by connecting all common electrodes in one district. Each sensing electrode 201 is correspondingly coupled to a touch control line 202 one by one. The detection circuit 10 of this embodiment performs detection to the sensing electrodes 201 of the touch screen panel 20 during the manufacture process of the touch screen panel 20, which includes detection to the sensing electrodes 201 themselves and detection to the touch control lines 202 connected to the detected sensing electrodes 201. The detection procedures can be performed before the connections of the touch control lines 202 and the touch control IC and after the connections of the touch control lines 202 and the sensing electrodes 201. The detection circuit 10 comprises a charging module 101 and a voltage measuring module 102.

The charging module 101 is employed to connect one touch control line 202 for charging a parasitic capacitance constructed by the one corresponding sensing electrode 201 and a ground via the touch control line 202 in one detection period. In this embodiment, in one detection period, the detection is performed to merely one sensing electrode 201. That is to say, one detection period is one detection. In one detection period, the charging module 101 is electrically connected to a touch control line 202, first to charge the parasitic capacitance constructed by the sensing electrode 201 corresponded with the touch control line 202 and the ground. The sensing electrode 201 can be an electric source module or other voltage output circuit. The output voltage of the charging module 101 is 5V, i.e. applying 5V charging voltage to the parasitic capacitance. Certainly, a 3V, 8V or 10V voltage can be used. No restriction is demanded herewith. For conveniently acquiring effective voltage data, the charging voltage is preferably to be more than 5V.

The voltage measuring module 102 is employed to electrically connect the touch control line 202 for acquiring a voltage measured value of the parasitic capacitance after charging via the touch control line 202 and outputting the voltage measured value, to obtain a detection result of normal or fault of the corresponding sensing electrode 201 corresponded with the touch control line 202 according to the voltage measured value after the charging module 101 accomplishes charging and is disconnected from the touch control line 202.

The electric capacity of the parasitic capacitance constructed by the sensing electrode 201 and the ground is basically stationary and the electric capacities of parasitic capacitances constructed by each sensing electrode and the ground are basically the same. Under normal circumstance, the parasitic capacitance possesses a certain voltage after charging and the voltage value is determined according to the charging volume. In this embodiment, the charging module 101 applies 5V charging voltage to the parasitic capacitance. Under normal circumstance, i.e. no faults happen to the sensing electrode 201 and the connected touch control line 202, the voltage of the corresponding parasitic capacitance after charging should be the same as the charging volume, basically, i.e. the obtained voltage measured value should be about 5V. If one or two of the sensing electrode 201 and the connected touch control line 202 are disconnected, the charging module 101 cannot charge the corresponding parasitic capacitance. The voltage of the parasitic capacitance after charging is basically zero. If one or two of the sensing electrode 201 and the connected touch control line 202 are short, for instance, the detected sensing electrode 201 is short with other sensing electrode 201 or other touch control line 202 is short, or the touch control line 202 connected with the detected sensing electrode 201 is short with other touch control line 202 or other sensing electrode 201, which will be equivalent to that parallel connection occurs to the plurality of parasitic capacitance and the total electric capacity increases. Therefore, with the same charging excitation pulse signals (i.e. the same charging time), the charging rate of the charging module 101 to the parasitic capacitance corresponded with the sensing electrode which is short decreases and the charging electric capacity of the parasitic capacitance decreases. Accordingly, the voltage of the parasitic capacitance decrease.

Therefore, the voltage measuring module 102 measures the voltage measured value of the parasitic capacitance after charging. Then, whether the sensing electrode 201 or the corresponding touch control line 202 is normal or not can be determined according to the voltage measured value. For instance, as the voltage measured value outputted from the voltage measuring module 102 is about 5V (such as 4.8V, 4.9V or 5.1V), the sensing electrode 201 and the corresponding touch control line 202 are considered to be normal; as the voltage measured value outputted from the voltage measuring module 102 approaches to 0V (such as 0.2V, 0.15V or 0.05V), the sensing electrode 201 and the corresponding touch control line 202 are considered to be disconnected and fault. The disconnection may happen to the sensing electrode 201 itself or the corresponding touch control line 202. Alternatively, disconnection happens to both of the sensing electrode 201 and the corresponding touch control line 202; as the voltage measured value outputted from the voltage measuring module 102 is far smaller than 5V (such as 3.5V, 3.8V or 2V), the sensing electrode 201 is considered to be short and fault, i.e. there is possibility that the detected sensing electrode 201 is short with other sensing electrode 201 or the touch control line 202 connected to the detected sensing electrode 201 is short with other touch control line 202.

Specifically, the voltage measured value as either of short condition and disconnection condition happens is smaller than the voltage measured value under normal circumstance, the voltage measured value of the parasitic capacitance is basically zero under the disconnection condition and the charging module 101 still can charge the parasitic capacitance under the disconnection condition. Therefore, the voltage measured value of the parasitic capacitance remains a certain value but not approaching to zero.

After one detection period is accomplished, the next detection period is started for implementing detection to the next touch control line 202 until the detections to all the touch control lines 202 are accomplished.

What the other embodiments can be different from this embodiments, the charging module 101 can employed to connect a plurality of touch control lines 202 at the same time, such as connecting two or three touch control lines 202 for charging the parasitic capacitances corresponded with the plurality of touch control lines 202 at the same time in one detection period. Now, it requires more charging time to make the charging volumes of the plurality of parasitic capacitances to reach the predetermined value (hypothetically, under circumstance that all the connected touch control lines 202 are normal) because the parasitic capacitances are parallel connected. Now, the voltage measuring module 102 sequentially electrically connects the plurality of touch control line 202 for sequentially acquiring voltage measured values of the corresponding parasitic capacitances after charging via the plurality of touch control lines 202 after the charging module 101 accomplishes the charging to the all connected touch control lines 202 at the same time and is disconnected from the plurality of touch control lines 202. Accordingly, the tester can determines whether the corresponding sensing electrodes 201 and touch control lines 202 are normal or not according to the voltage measured values. That is to say, whether the sensing electrodes 201 and the touch control lines 202 are normal, short or disconnected can be determined according to the voltage measured values. By acquiring the voltage measured values of the parasitic capacitances one by one, the location of the faulted sensing electrode 201 can be confirmed for the following repair.

In this embodiment of the detection circuit, the connection can be manually implemented by the tester to realize the charging of the charging module 101 and the measurements of the voltage measuring module 102.

Figure 2:
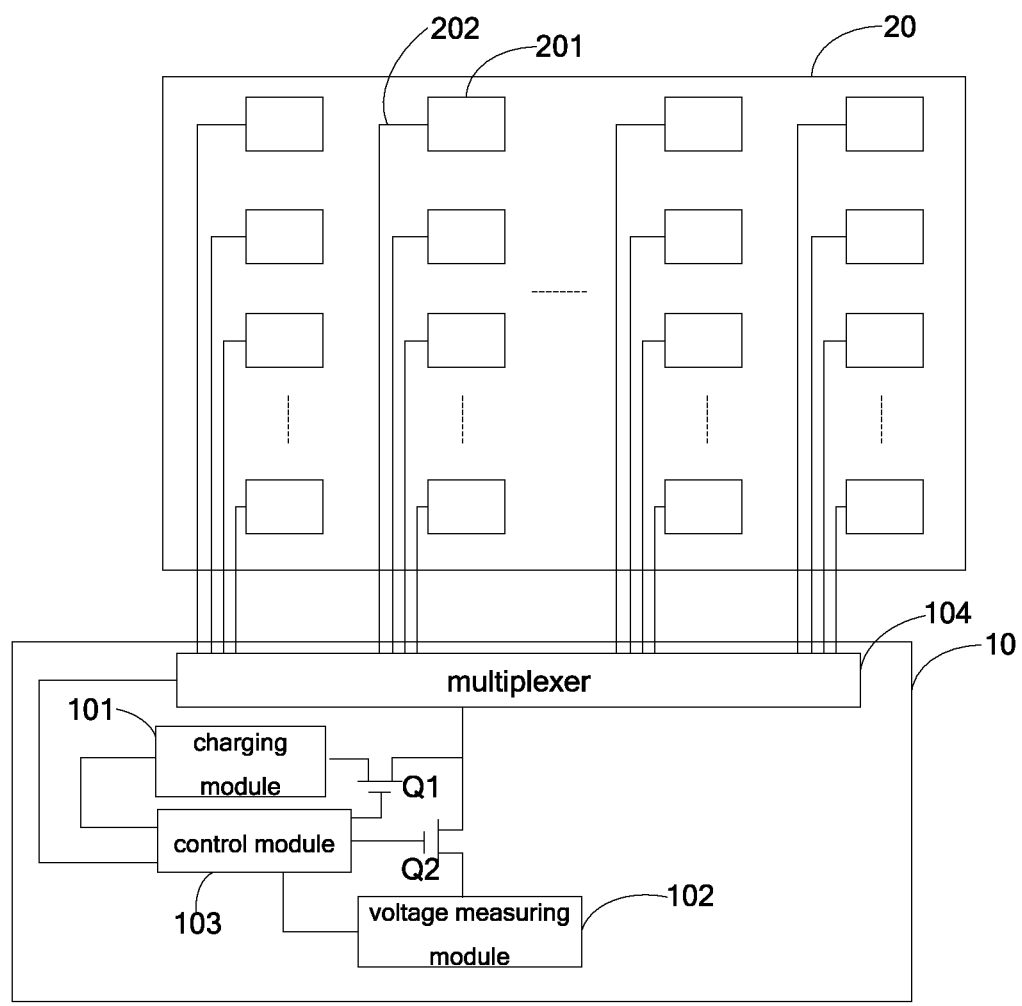
FIG. 2 is a structural diagram of a detection circuit of a self-capacitance touch screen according to another embodiment of the present invention.

Please refer to FIG. 2. In a detection circuit of a self-capacitance touch screen according to another embodiment of the present invention, the automatic detection can be achievable which tremendously improves the detection efficiency. As shown in FIG. 2, the detection circuit 10 further comprises a control module 103, a first switch Q1, a second switch Q2 and a multiplexer 104. The multiplexer 104 comprises a plurality of first channels and a second channel. The first channels and the second channel can be input ends and output ends. Each touch control line 202 is electrically connected to a first channel of the multiplexer 104. One end of the first switch Q1 and one end of the second switch Q2 are electrically connected to the second channel of the multiplexer 104. The other end of the first switch Q1 is electrically connected to an output end of the charging module 101. The other end of the second switch Q2 is electrically connected to an input end of the voltage measuring module 102. In this embodiment, both the first switch Q1 and the second switch Q2 are transistors of the same type. Both switches are conducted by high voltage level and cut off by low voltage level. Certainly, triode transistors or other three ends control switches can be utilized. The control module 103 comprises two voltage level output ends, which are respectively connected to a control end of the first switch Q1 and a control end of the second switch Q2 for respectively controlling the conduction or cut-off of the first switch Q1, the second switch Q2; the control module 103 further comprises a control signal output end of the multiplexer 104 which is connected to a control end of the multiplexer 104 for achieving the gating function of the multiplexer 104.

In one detection period, the working procedure is described below: the control module 103 first controls the multiplexer 104 to select one touch control line 202 to be electrically connected to the one end of the first switch Q1, i.e. the first channel and the second channel of the multiplexer 104 which is electrically connected to the touch control line 202 are connected for electrically connecting touch control line 202 and the one end of the first switch Q1. Then, the control module 103 inputs high voltage level to the control end of the first switch Q1 to control the first switch Q1 to be conducted to electrically connect the charging module 103 and the touch control line 202 for charging the parasitic capacitance constructed by the sensing electrode 201 corresponded with the selected touch control line 202 and the ground. The control module 103 controls the first switch Q1 to be off after the charging is accomplished and the first channel and the second channel connecting the touch control line 202 maintain to be electrically connected for connecting the touch control line 202 and the one end of the second switch Q2. Then, the control module 103 controls the second switch Q2 to be conducted to electrically connect the voltage measuring module 102 and the touch control line 202 for acquiring a voltage measured value of the parasitic capacitance constructed by the sensing electrode 201 corresponded with the touch control line 202 and the ground and outputs the voltage measured value. Accordingly, whether the sensing electrode 201 and the touch control line 202 are normal or not can be determined according to the voltage measured value. After the voltage measuring module 102 acquires the voltage measured value of the parasitic capacitance, the control module 103 controls the second switch Q2 to be off and the detection to the next sensing electrode 201 starts until the detections to all the sensing electrodes 201 are accomplished.

With the aforesaid detection circuit, manual connections or disconnections of the touch control lines are not necessary. Meanwhile, the detection to the sensing electrodes 201 in sequence can be realized. The detection efficiency can be tremendously improved and the specific location of the faulted sensing electrode 201 can be accurately confirmed.

Certainly in other embodiments, in one detection period, charging the plurality of parasitic capacitances can be implemented first. The control module 103 controls the multiplexer 104 to select a plurality of touch control lines 202 to be electrically connected to the one end of the first switch Q1 at the same time. After the charging module 101 accomplishes the charging, the control module 103 controls the multiplexer 104 to sequentially select one of the at least one touch control line to be electrically connected to the one end of the second switch Q2 for the voltage measuring module 102 to sequentially acquire the voltage measured value of the parasitic capacitance corresponded with the sensing electrode 201 connected to the touch control line 202. The detection to the sensing electrodes 201 in sequence can be realized. Then, the next detection period is performed.

Figure 3:
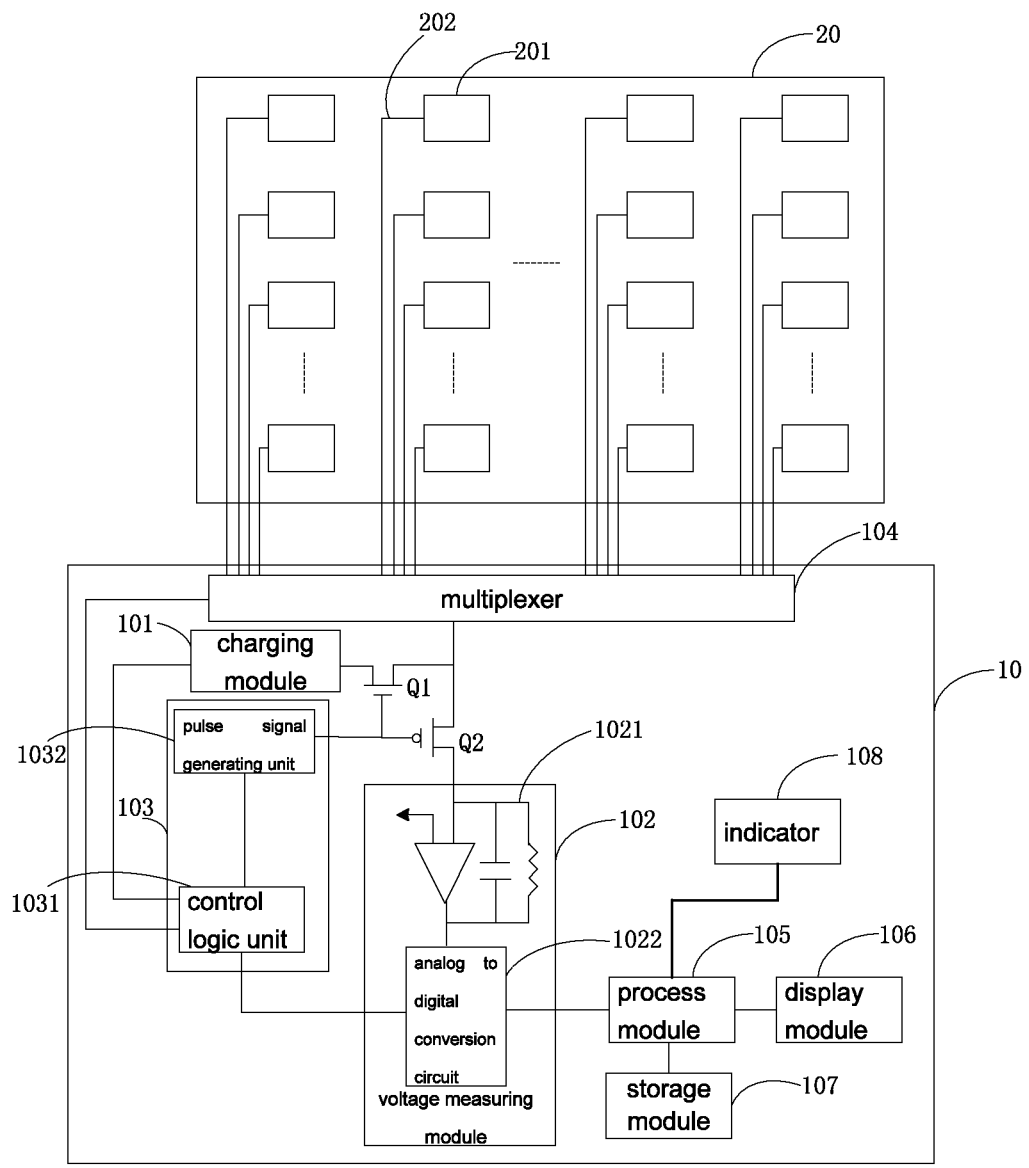
FIG. 3 is a structural diagram of a detection circuit of a self-capacitance touch screen according to one another embodiment of the present invention.

Please refer to FIG. 3. In a detection circuit of a self-capacitance touch screen according to one another embodiment of the present invention, in one detection period, the detection to one touch control line 202 is illustrated. The conduction voltage levels of the first switch Q1 and the second switch Q2 are different. The first switch Q1 is a N-type thin film transistor, which is conducted by high voltage level and cut off by low voltage level. The second switch Q2 is a P-type thin film transistor, which is cut off by high voltage level and conducted by low voltage level. The control module 103 comprises a control logic unit 1031 and a pulse signal generating unit 1032. The control logic unit 1031 can be a process as an illustration and connected to the pulse signal generating unit 1032 for controlling the pulse signal generating unit 1032 to output pulse signals. Meanwhile, the control logic unit 1031 is also connected to the charging module 101 and the voltage measuring module 102, which the control module coordinates their workings. The control logic unit 1031 is electrically connected to the control end of the multiplexer 104 and employed for controlling the multiplexer 104 to achieve the switch function. An output end of the pulse signal generating unit 1032 is electrically connected to the control end of the first switch Q1, the control end of the second switch Q2.

The pulse signal generating unit 1032 is a square wave pulse signal generating unit and the output signal is a square wave signal. Because the conduction voltage levels of the first switch Q1 and the second switch Q2 respectively are high voltage level and low voltage level. When the pulse signal generating unit 1032 outputs high voltage level, the first switch Q1 is conducted and the second switch Q2 is cut off. When the pulse signal generating unit 1032 outputs low voltage level, the first switch Q1 is cut off and the second switch Q2 is conducted. Therefore, the conduction and cutting off of the first switch Q1 and the second switch Q2 can be respectively controlled with one output end. The circuit can be more simplified as realizing the detections to the sensing electrodes 201.

Furthermore, in this embodiment as showing in FIG. 3, the voltage measuring module 102 is a discharging circuit, employed to realize the discharging to the parasitic capacitance to receive the voltage measured value fed back from the parasitic capacitance after charging. The detection circuit 10 further comprises a process module 105 and a display module 106.

The voltage measuring module 102 comprises an amplifying circuit 1021 and an analog to digital conversion circuit (ADC) 1022. An input end of the amplifying circuit 1021 is electrically connected to the other end of the second switch Q2, and an output end of the amplifying circuit 1021 is electrically connected to an input end of the analog to digital conversion circuit 1022. An output end of the analog to digital conversion circuit 1022 is electrically connected to the process module 105. The display module 106 and the process module 105 are electrically connected.

In one detection period, the control logic unit 1031 sends a control signal to the multiplexer 104 to make the multiplexer 104 select one touch control line 202 to be electrically connected to the first switch Q1. Then, the pulse signal generating unit 1032 outputs a high voltage level signal to control the first switch Q1 to be conducted and the second switch Q2 to be cut off. The charging module 101 applies 5V charging voltage to the parasitic capacitance constructed by the corresponding sensing electrode and the ground via the selected touch control line 202. By setting the duty ratio of the pulse signals, the time that the pulse signal generating unit 1032 outputs high voltage level is the charging time of the charging module 101. After the charging module 101 accomplishes the charging, the voltage level signal outputted from the pulse signal generating unit 1032 changes from high voltage level to low voltage level for controlling the first switch Q1 to be cut off and the second switch Q2 to be conducted. In one detection period of this embodiment, the detection is performed to merely one sensing electrode 201 and one touch control line 202 connected thereto. Therefore, the first channel and the second channel are maintained to be electrically connected with the detected touch control line 202 in one detection period. That is to say, in one detection period, the detected touch control line 202 maintains to be electrically connected with the one end of the first switch Q1 and the one end of the second switch Q2 via the multiplexer 104. When the second switch Q2 is conducted, the voltage measuring module 102 is electrically connected to the detected touch control line 202 to amplify the voltage measured value fed back from the parasitic capacitance constructed by the corresponding sensing electrode 201 and the ground, and then converted by the analog to digital conversion circuit 1022. The process module 105 reads the converted voltage measured value and determines whether the voltage measured value is in a predetermined range. When the process module 105 determines that the voltage measured value is in a first predetermined range, the display module 106 is employed to show a message that the sensing electrode 201 is normal, such as to show "sensing electrode normal"; When the process module 105 determines that the voltage measured value is in a second predetermined range, the display module 106 is employed to show a message that the sensing electrode 201 is disconnected, such as to show "sensing electrode disconnected"; When the process module 105 determines that the voltage measured value is in a third predetermined range, the display module 106 is employed to show a message that the sensing electrode 201 is short, such as to show "sensing electrode short". The first predetermined range, the second predetermined range and the third predetermined range are the voltages obtained by the parasitic capacitance after the charging module 101 accomplishes the charging when the sensing electrode 201 is respectively in normal state, disconnected state and short state. The predetermined ranges can be set according to the scales of the charging voltages.

The sensing electrode 201 normal means that both the sensing electrode 201 itself and the connected touch control line 202 are normal; the sensing electrode 201 disconnected means that one or two of the sensing electrode 201 and the connected touch control line 202 are disconnected; the sensing electrode 201 short means that one or two of the sensing electrode 201 and the connected touch control line 202 are short.

In this embodiment, the charging voltage is 5V. Under normal circumstance, in which both the sensing electrode 201 and the connected touch control line 202 are not faulted, the voltage of the corresponding parasitic capacitance after charging should be the same as the charging volume, i.e. the obtained voltage measured value should be about 5V. If one or two of the sensing electrode 201 and the connected touch control line 202 are disconnected, the charging module 101 cannot charge the corresponding parasitic capacitance. The voltage of the parasitic capacitance after charging is basically zero; if the sensing electrode 201 is short with other sensing electrode 201 or other touch control line 202 is short, or the touch control line 202 connected with the detected sensing electrode 201 is short with other touch control line 202 or other sensing electrode 201, which will be equivalent to that parallel connection occurs to the plurality of parasitic capacitance and the total electric capacity increases. Therefore, with the same charging excitation pulse signals (i.e. the same charging time), the charging rate of the charging module 101 to the parasitic capacitance corresponded with the sensing electrode which is short decreases and the charging electric capacity of the parasitic capacitance decreases. Accordingly, the voltage of the parasitic capacitance decrease. Therefore, the first predetermined range can be 4.5V~5.2V or 4.8V~5.1V; the second predetermined range can be 0V~0.5V or 0.05V~0.2V; the third predetermined range can be 1.5V~3.5V or 2.0V~3.8V.

According to this embodiment of the present invention, the automatic detection can be achievable which improves the detection efficiency. With the display module 106 functioning, the detection result can be directly observed.

Besides, the detection circuit 10 further comprises a storage module 107, and the storage module 107 is electrically connected to the process module 105, and employed for storing the voltage measured value for the checking later.

The detection circuit 10 of this embodiment can further comprise an indicator 108, and employed for indicating whether faults happen to the detected sensing electrode. The indicator 108 is electrically connected to the process module 105, and the process module 105 controls the indicator 108 to illuminate to indicate that faults happen to the detected sensing electrode as the process module 105 determines that the voltage measured value is not in the normal predetermined range. The indicator 108 does not illuminate as the process module 105 determines that the voltage measured value is in the first predetermined range. With the indicator 108 functioning, whether faults happen to the detected sensing electrode can be directly and quickly determined.

Certainly, in other embodiments, one of the indicator 108 and the display module 106 can merely be set for outputting the detection result.

Figure 4:
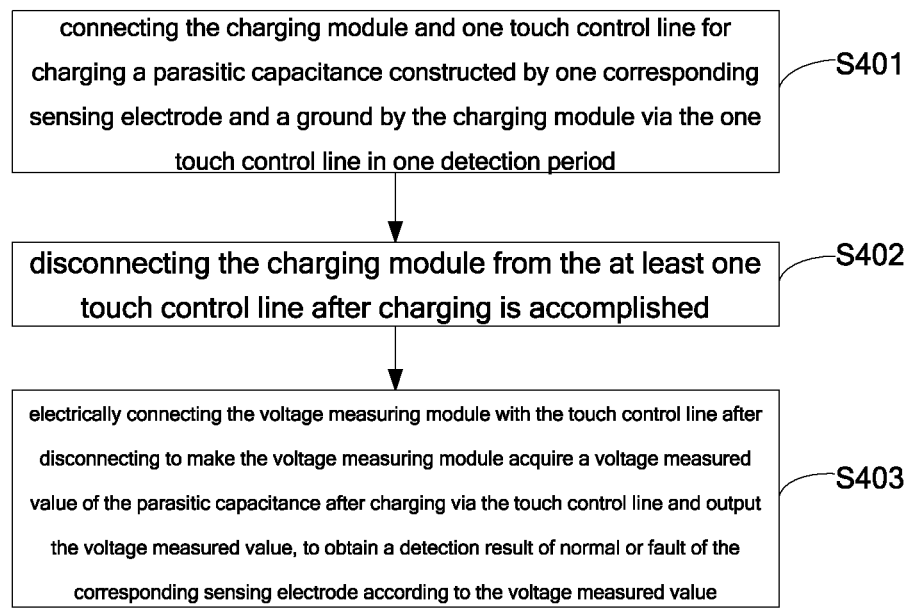
FIG. 4 is a flowchart of a detection method of a self-capacitance touch screen according to one embodiment of the present invention.

Please refer to FIG. 4. The present invention further provides a detection method of a self-capacitance touch screen, and the method comprises steps of:

Step S401: connecting the charging module and one touch control line for charging a parasitic capacitance constructed by one corresponding sensing electrode and a ground by the charging module via the one touch control line in one detection period.

In this embodiment, in one detection period, the detection is performed to merely one sensing electrode. That is to say, one detection period is one detection. In one detection period, the charging module is electrically connected to a touch control line, first to charge the parasitic capacitance constructed by the sensing electrode corresponded with the touch control line and the ground. The sensing electrode 201 can be an electric source module or other voltage output circuit. The output voltage of the charging module can be 3V, 5V or 10V. No restriction is demanded herewith. In this embodiment, the charging voltage to the parasitic capacitance is 5V.

Step S402, disconnecting the charging module from the at least one touch control line after charging is accomplished.

After the charging module accomplishes the charging, the charging module is disconnected with the touch control line.

Step S403, electrically connecting the voltage measuring module with the touch control line after disconnecting to make the voltage measuring module acquire a voltage measured value of the parasitic capacitance after charging via the touch control line and output the voltage measured value, to obtain a detection result of normal or fault of the corresponding sensing electrode according to the voltage measured value.

After the charging module is disconnected with the touch control line, the voltage measuring module is electrically connected to the touch control line to measure the voltage value of the parasitic capacitance and output the voltage measured value. The voltage measuring module can be voltage measurement instrument, such as a voltmeter or an oscilloscope. Therefore, the specific step of outputting the voltage measured value is to show the voltage measured value. Certainly, it can be sending the voltage measured value to other indicators or to other indicators for display.

The electric capacity of the parasitic capacitance constructed by the sensing electrode and the ground is basically stationary and the electric capacities of parasitic capacitances constructed by each sensing electrode and the ground are basically the same. Under normal circumstance, the parasitic capacitance possesses a certain voltage after charging and the voltage value is determined according to the charging volume. After the charging module applies charging voltage to the parasitic capacitance, under normal circumstance, i.e. no faults happen to the sensing electrode and the connected touch control line, the voltage of the corresponding parasitic capacitance after charging should be the same as the charging volume, basically. If the sensing electrode or the connected touch control line is disconnected, the charging module cannot charge the corresponding parasitic capacitance. The voltage of the parasitic capacitance after charging is basically zero. If the sensing electrode or the connected touch control line is short, which will be equivalent to that parallel connection occurs to the plurality of parasitic capacitance and the total electric capacity increases. Therefore, with the same charging excitation pulse signals (i.e. the same charging time), the charging rate of the charging module to the parasitic capacitance corresponded with the sensing electrode which is short decreases and the charging electric capacity of the parasitic capacitance decreases. Accordingly, the voltage of the parasitic capacitance decrease.

Therefore, whether the sensing electrode is normal or not can be determined by obtaining the voltage measured value of the parasitic capacitance after charging to achieve the detection to the sensing electrode.

The detection to the sensing electrodes can be achieved by manual detection according to the aforesaid steps. Alternatively, the automatic detection to the sensing electrodes can be achieved with the detection circuits shown in FIG. 2, FIG. 3. to improve the detection efficiency.

Certainly in other embodiments, in one detection period, charging the plurality of parasitic capacitances can be implemented first, i.e. the charging module is connected to the plurality of touch control lines for charging the plurality of parasitic capacitances corresponded with the plurality of touch control lines. Now, the voltage measuring module sequentially electrically connects the plurality of touch control line for sequentially acquiring voltage measured values of the corresponding parasitic capacitances after charging via the plurality of touch control lines after the charging module accomplishes the charging to the all connected touch control lines at the same time and is disconnected from the plurality of touch control lines. Accordingly, the tester can determine whether the corresponding sensing electrodes and touch control lines are normal or not according to the voltage measured values. That is to say, whether the sensing electrodes and the touch control lines are normal, short or disconnected can be determined according to the voltage measured values.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A detection circuit of a self-capacitance touch screen, wherein the self-capacitance touch screen comprises a plurality of sensing electrodes arranged in array and insulated with one another, and each sensing electrode is correspondingly coupled to a touch control line, and the detection circuit comprises: a charging module, a voltage measuring module, a control module, a first switch, a second switch and a multiplexer;

each touch control line is electrically connected to a first channel of the multiplexer, and a second channel of the multiplexer is electrically connected to one end of the first switch, one end of the second switch, and the other end of the first switch is electrically connected to an output end of the charging module, and the other end of the second switch is electrically connected to an input end of the voltage measuring module, and the control module is respectively, electrically connected to a control end of the multiplexer, a control end of the first switch and a control end of the second switch;

in one detection period, the control module controls the multiplexer to select the at least one touch control line to be electrically connected to the one end of the first switch, and controls the first switch to be conducted to electrically connect the charging module and the at least one touch control line for respectively charging a parasitic capacitance constructed by the at least one corresponding sensing electrode and a ground via the at least one touch control line at the same time, wherein a charging voltage outputted from the charging module is more than 5V; the control module controls the first switch to be off after charging the parasitic capacitance is accomplished, and controls the multiplexer to sequentially select one of the at least one touch control line to be electrically connected to the one end of the second switch, and the control module controls the second switch to be conducted as the touch control line selected by the multiplexer is electrically connected to the one end of the second switch to electrically connect the voltage measuring module and the touch control line selected by the multiplexer for acquiring a voltage measured value of the parasitic capacitance after charging via the touch control line selected by the multiplexer and outputting the voltage measured value, to obtain a detection result of normal or fault of the corresponding sensing electrode according to the voltage measured value.

2. The detection circuit according to claim 1, wherein the control module comprises a control logic unit and a pulse signal generating unit, and the control logic unit and the pulse signal generating unit are electrically connected to make the pulse signal generating unit output pulse signals, and a control end of the multiplexer is electrically connected to the control logic unit, and an output end of the pulse signal generating unit is electrically connected to the control end of the first switch, the control end of the second switch;

the first switch is a N-type thin film transistor, and the second switch is a P-type thin film transistor, the first switch is conducted as the pulse signal generating unit outputs a high voltage level, and the second switch is conducted as the pulse signal generating unit outputs a low voltage level.

3. The detection circuit according to claim 2, wherein the voltage measuring module is a discharging circuit, employed to sequentially receive the voltage measured value fed back from the parasitic capacitance constructed by the at least one sensing electrode corresponded with the at least one touch control line and a ground;

the detection circuit further comprises a process module and a display module, and the process module is electrically connected to an output end of the display module, and employed for sequentially reading the voltage measured value and determining whether the voltage measured value is in a predetermined range, and the display module is electrically connected to the process module, employed for showing a message that the corresponding sensing electrode is normal as the process module determines that the voltage measured value is in a first predetermined range, and showing a message that the corresponding sensing electrode is off as the process module determines that the voltage measured value is in a second predetermined range, and showing a message that the corresponding sensing electrode is short as the process module determines that the voltage measured value is in a third predetermined range.

4. The detection circuit according to claim 3, wherein
the voltage measuring module comprises an amplifying circuit and an analog to digital conversion circuit, and an input end of the amplifying circuit is electrically connected to the other end of the second switch, and an output end of the amplifying circuit is electrically connected to an input end of the analog to digital conversion circuit, and an output end of the analog to digital conversion circuit is electrically connected to the process module.

5. The detection circuit according to claim 3, wherein
the detection circuit further comprises a storage module, and the storage module is electrically connected to the process module, and employed for storing the voltage measured value.

6. The detection circuit according to claim 3, wherein
the detection circuit further comprises an indicator, and the indicator is electrically connected to the process module, and the process module controls the indicator to illuminate to indicate that faults happen the corresponding sensing electrode as the process module determines that the voltage measured value is not in the first predetermined range.

7. A detection circuit of a self-capacitance touch screen, wherein the self-capacitance touch screen comprises a plurality of sensing electrodes arranged in array and insulated with one another, and each sensing electrode is correspondingly coupled to a touch control line, and the detection circuit comprises: a charging module and a voltage measuring module;
the charging module is employed to connect the at least one touch control line for respectively charging a parasitic capacitance constructed by the at least one corresponding sensing electrode and a ground via the at least one touch control line at the same time in one detection period;
the voltage measuring module is employed to electrically connect the at least one touch control line sequentially for acquiring a voltage measured value of the parasitic capacitance after charging via the at least one touch control line and outputting the voltage measured value, to obtain a detection result of normal or fault of the corresponding sensing electrode according to the voltage measured value after the charging module accomplishes charging and is disconnected from the at least one touch control line;
wherein the detection circuit comprises a control module, a first switch, a second switch and a multiplexer, and each touch control line is electrically connected to a first channel of the multiplexer, and a second channel of the multiplexer is electrically connected to one end of the first switch, one end of the second switch, and the other end of the first switch is electrically connected to an output end of the charging module, and the other end of the second switch is electrically connected to an input end of the voltage measuring module, and the control module is respectively, electrically connected to a control end of the multiplexer, a control end of the first switch and a control end of the second switch; and
in one detection period, the control module controls the multiplexer to select the at least one touch control line to be electrically connected to the one end of the first switch, and controls the first switch to be conducted to electrically connect the charging module and the at least one touch control line; the control module controls the first switch to be off after charging the parasitic capacitance is accomplished, and controls the multiplexer to sequentially select one of the at least one touch control line to be electrically connected to the one end of the second switch, and the control module controls the second switch to be conducted as the touch control line selected by the multiplexer is electrically connected to the one end of the second switch to electrically connect the voltage measuring module and the touch control line selected by the multiplexer.

8. The detection circuit according to claim 7, wherein
the control module comprises a control logic unit and a pulse signal generating unit, and the control logic unit and the pulse signal generating unit are electrically connected to make the pulse signal generating unit output pulse signals, and a control end of the multiplexer is electrically connected to the control logic unit, and an output end of the pulse signal generating unit is electrically connected to the control end of the first switch, the control end of the second switch;
the first switch is a N-type thin film transistor, and the second switch is a P-type thin film transistor, the first switch is conducted as the pulse signal generating unit outputs a high voltage level, and the second switch is conducted as the pulse signal generating unit outputs a low voltage level.

9. The detection circuit according to claim 8, wherein
the voltage measuring module is a discharging circuit, employed to sequentially receive the voltage measured value fed back from the parasitic capacitance constructed by the at least one sensing electrode corresponded with the at least one touch control line and a ground;
the detection circuit further comprises a process module and a display module, and the process module is electrically connected to an output end of the display module, and employed for sequentially reading the voltage measured value and determining whether the voltage measured value is in a predetermined range, and the display module is electrically connected to the process module, employed for showing a message that the corresponding sensing electrode is normal as the process module determines that the voltage measured value is in a first predetermined range, and showing a message that the corresponding sensing electrode is off as the process module determines that the voltage measured value is in a second predetermined range, and showing a message that the corresponding sensing electrode is short as the process module determines that the voltage measured value is in a third predetermined range.

10. The detection circuit according to claim 9, wherein
the voltage measuring module comprises an amplifying circuit and an analog to digital conversion circuit, and an input end of the amplifying circuit is electrically connected to the other end of the second switch, and an output end of the amplifying circuit is electrically connected to an input end of the analog to digital conversion circuit, and an output end of the analog to digital conversion circuit is electrically connected to the process module.

11. The detection circuit according to claim 9, wherein
the detection circuit further comprises a storage module, and the storage module is electrically connected to the process module, and employed for storing the voltage measured value.

12. The detection circuit according to claim 9, wherein
the detection circuit further comprises an indicator, and the indicator is electrically connected to the process module, and the process module controls the indicator to illuminate as the process module determines that the voltage measured value is not in the first predetermined range to indicate that the corresponding sensing electrode is out of order.

* * * * *